(12) United States Patent
von Kaenel et al.

(10) Patent No.: US 7,372,323 B2
(45) Date of Patent: May 13, 2008

(54) RESONANCE LIMITER CIRCUITS FOR AN INTEGRATED CIRCUIT

(75) Inventors: Vincent R. von Kaenel, Palo Alto, CA (US); Daniel W. Dobberpuhl, Menlo Park, CA (US)

(73) Assignee: P.A. Semi, Inc., Santa Clara, CA (US)

( * ) Notice: Subject to any disclaimer, the term of this patent is extended or adjusted under 35 U.S.C. 154(b) by 6 days.

(21) Appl. No.: 11/493,104

(22) Filed: Jul. 26, 2006

(65) Prior Publication Data

US 2007/0257721 A1    Nov. 8, 2007

Related U.S. Application Data

(60) Provisional application No. 60/798,084, filed on May 5, 2006.

(51) Int. Cl.
*H03K 5/00* (2006.01)
(52) U.S. Cl. .................. 327/551; 327/309; 327/311; 327/557
(58) Field of Classification Search ............... 327/331, 327/531, 532, 551–559, 309, 311; 716/10; 326/33
See application file for complete search history.

(56) References Cited

U.S. PATENT DOCUMENTS

| | | | |
|---|---|---|---|
| 3,639,685 A * | 2/1972 | Morio | 348/659 |
| 6,995,605 B2 * | 2/2006 | Hazucha et al. | 327/551 |
| 7,030,461 B2 | 4/2006 | Vassilev | |
| 7,054,122 B2 | 5/2006 | Chen et al. | |
| 7,057,867 B1 | 6/2006 | Vashchenko et al. | |
| 7,061,737 B2 | 6/2006 | Chen | |
| 7,143,381 B2 * | 11/2006 | Zhao et al. | 716/10 |

* cited by examiner

*Primary Examiner*—Dinh T. Le
(74) *Attorney, Agent, or Firm*—Lawrence J. Merkel; Meyertons, Hood, Kivlin, Kowert & Goetzel, P.C.

(57) ABSTRACT

In one embodiment, an integrated circuit comprises resonance limiter circuits coupled to a power supply connection of the integrated circuit. The resonance limiter circuits are configured to detect oscillation on the power supply connection at a resonant frequency, and to dampen the resonant frequency oscillation responsive to detecting the oscillation. In some embodiments, the resonance limiter circuits may damp oscillation at or above the resonant frequency or approximately the resonant frequency (e.g. somewhat below the resonance frequency). The resonant frequency depends on a package of the integrated circuit. In an embodiment, a resonance limiter circuit comprises a filter and a transistor coupled in parallel with the filter between a power supply connection and a ground connection. The filter is tuned to approximately a resonant frequency (e.g. the lowest resonant frequency) that depends on a package corresponding to an integrated circuit into which the resonance limiter circuit is fabricated.

21 Claims, 5 Drawing Sheets

RESONANCE LIMITER CIRCUITS FOR AN INTEGRATED CIRCUIT

This application claims benefit of priority to U.S. Provisional Patent Application Ser. No. 60/798,084, filed May 5, 2006.

BACKGROUND

1. Field of the Invention

This invention is related to the field of integrated circuits and, more particularly, to managing resonant frequencies on power supply inputs to the integrated circuit.

2. Description of the Related Art

As semiconductor fabrication technologies have continued to advance, larger numbers of transistors have been fabricated onto a single integrated circuit and the operating frequencies of these integrated circuits have continued to increase. Additionally, power supply voltages have decreased while power supply currents have increased in both magnitude and time variation. One effect of large, rapid swings in supply current magnitude is that resonance can be induced due to the combination of serial inductance in the package that surrounds the integrated circuit and the bypass capacitance (which can include on-die and external bypass capacitors). Resonance tends to grow and to last for long periods of time, unlike transient signals at non-resonant frequencies, which tend to die out relatively quickly.

Resonance on the supply voltage (also known as ringing) reduces the timing margin in the integrated circuit, which expects a relatively stable supply voltage. In the extreme, resonance can cause faulty operation of the integrated circuit.

One way that resonance has been limited or avoided in the past is to increase the serial resistance in the package to damp the resonance. However, such techniques have a practical limit. The IR drop in the package is increased by increasing the serial resistance, thus reducing the effective operating voltage that the integrated circuit itself experiences for a given externally-supplied voltage and for a given current. Furthermore, increasing the serial resistance increases the power consumption of the package itself, which can be problematic if the integrated circuit is a high power consumer or if the integrated circuit is designed for power-conscious applications such as battery-powered devices or devices with limited cooling capabilities.

SUMMARY

In one embodiment, an integrated circuit comprises a plurality of resonance limiter circuits coupled to a power supply connection of the integrated circuit. The resonance limiter circuits are configured to detect oscillation on the power supply connection at or above a certain frequency, which may be approximately a resonant frequency. The resonance limiter circuits are configured to dampen the oscillation responsive to detecting the oscillation. The resonant frequency depends on a package of the integrated circuit.

In an embodiment, a resonance limiter circuit comprises a filter and a transistor coupled in parallel with the filter between a power supply connection and a ground connection. The filter is tuned to approximately a resonant frequency that depends on a package corresponding to an integrated circuit into which the resonance limiter circuit is fabricated. Particularly, in one embodiment, the filter may be tuned to a minimum resonant frequency of the package, if more than one resonant frequency exists for the package.

In one embodiment, a method comprises: instantiating a plurality of resonance limiter circuits in an integrated circuit design, the plurality of resonance limiter circuits physically distributed across the integrated circuit design; and tuning the plurality of resonance limiter circuits to at least one approximate resonant frequency that depends on a package comprising the integrated circuit.

BRIEF DESCRIPTION OF THE DRAWINGS

The following detailed description makes reference to the accompanying drawings, which are now briefly described.

Figure 1:
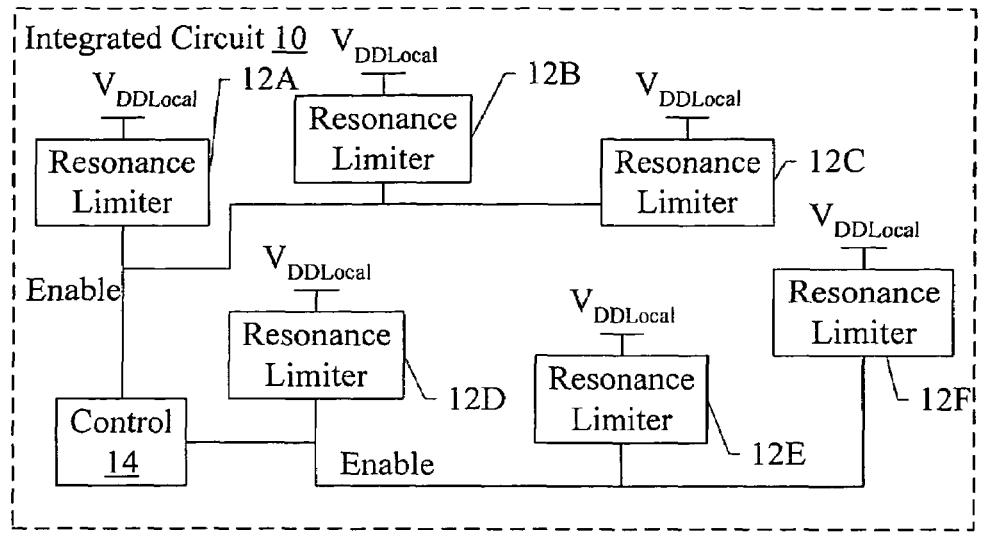
FIG. 1 is a block diagram of one embodiment of an integrated circuit including resonance limiter circuits.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the illustrated embodiment, the integrated circuit (IC) 10 comprises multiple resonance limiter circuits such as circuits 12A-12F and a control unit 14. Additionally, the integrated circuit 10 may comprise one or more functional blocks (not shown in FIG. 1) to implement the operation for which the integrated circuit 10 is designed. The resonance limiter circuits 12A-12F are coupled to receive an enable from the control unit 14 and are coupled to a power supply connection to receive a local supply voltage ($V_{DDLocal}$).

The resonance limiter circuits 12A-12F are configured to detect variation on the supply voltage at or near a resonant frequency that depends on the package into which the integrated circuit 10 will be placed. More particularly, the resonant frequency may depend on the electrical characteristics of the package. The resonant frequency may also be dependent on the integrated circuit 10 (e.g. the input capacitance and/or bypass capacitance of the integrated circuit 10 on the power supply connection) and on characteristics of a circuit board to which the package is attached (e.g. bypass capacitance attached to the power supply connection on the board). As used herein, a package may comprise any housing into which the integrated circuit can be placed for protecting the integrated circuit and providing electrical connection of the integrated circuit to other components.

Packages may include many configurations, such as pin through hole or surface mount technologies. Surface mount packages may include plastic flat packs, quad plastic flat packs (QFPS), ceramic flat packs, quad ceramic flat packs, ball grid array (BGA) packages, pin grid array (PGA) packages, etc.

If a given resonance limiter circuit 12A-12F detects variation at the resonant frequency, the circuit may dampen the variation. For example, the resonance limiter circuit 12A-12F may draw current to dampen the voltage swing at the resonant frequency. Thus, for example, if the resonance is occurring due to rapid current changes to circuitry in the functional blocks of the integrated circuit, the resonance limiter circuits may lessen the magnitude of the current changes by drawing current to replace current that is suddenly not being drawn. Oscillation at the resonant frequency may be reduced or eliminated. In some embodiments, the resonance limiter circuit 12A-12F detects variation at or above a "tuned frequency" to which the resonance limiter circuit is tuned. The resonance limiter circuit 12A-12F may dampen oscillation for frequencies greater than or equal to the tuned frequency.

In some embodiments, there may be more than one resonant frequency. Various resonance limiter circuits 12A-12F may be tuned to different resonant frequencies, to dampen the oscillations at those resonant frequencies. In one embodiment, resonance limiter circuits tuned to a given resonant frequency may be physically distributed about the integrated circuit 10. That is, resonance limiter circuits in close physical proximity may be tuned to different resonant frequencies. Alternatively, in embodiments in which the resonance limiter circuits are designed to damp frequencies at or above the tuned frequency, the tuned frequency may correspond to the lowest of the resonant frequencies (e.g. the tuned frequency may be approximately the lowest resonant frequency, such as somewhat below the lowest resonant frequency). For brevity, this description may refer to detecting a resonant frequency and operating to damp the resonant frequency. Similar operation may occur for any frequency higher than the tuned frequency of the resonance limiter circuits 12A-12F.

It is noted that calculating the resonant frequencies may be relatively complex and/or inaccurate during the design phase. Packaging details may change (or a given integrated circuit may be offered with multiple packaging options). Additionally, the resonant frequencies may be affected by the integrated circuit 10 itself (which may change over the design cycle) and by the board to which the packaged integrated circuit is attached during use. Accordingly, the resonance limiter circuits 12A-12F may be tuned to approximately the resonant frequency. For example, in some embodiments described below, a high pass filter is used to detect the resonant frequency. Thus, tuning the filter to somewhat below the resonant frequency (e.g. up to about 10% below the resonant frequency) may be acceptable. Alternatively or in addition, the resistor and/or capacitor in the filter may be made programmable so that fine tuning of the filter may be performed during use. For example, the resistor and/or capacitor may be fuseably programmable at manufacture, programmable via pin tie ups or tie downs, and/or software programmable in a register. The filter may also be a low pass filter, in some embodiments. However, from the point of view of the sensing device in the resonance limiter circuits, the filter is high pass. That is, the resonance filter circuit may damp oscillation of the frequency to which the filter is tuned or higher.

The resonance limiter circuits 12A-12F may be physically distributed across the integrated circuit 10. In many integrated circuits, the operating frequency of the circuit and sometimes rapid current changes may cause variations in the supply voltage across the integrated circuit 10. Thus, at any given point in time, some of the resonance limiter circuits 12A-12F may be "on" (having detected the resonant frequency and attempting to dampen the oscillation) while others may be "off". As mentioned above, the resonance limiter circuits 12A-12F are coupled to the power supply connection to receive a local supply voltage. The local supply voltage may be the supply voltage that exists within the immediate physical vicinity of the resonance limiter circuit. For example, integrated circuits may include one or more power planes in the wiring layers to supply the power supply voltage to the integrated circuit 10. The power planes may be relatively continuous (although vias may be provided for signal connection), or may comprise parallel strips of conductor in a plane. The resonance limiter circuits 12A-12F may be connected to the power plane physically near the corresponding circuit. The power planes may be electrically connected to package leads, which may be connected to one or more power pins on the exterior of the package. The pins may include metal conductors, the balls of a BGA, or any other external conductor. In many modern packages, tens or even hundreds of external conductors may be dedicated to providing power to the integrated circuit 10. Similarly, the voltage reference ($V_{SS}$, or ground for the integrated circuit 10, which may or may not be the same voltage reference or ground for the board to which the integrated circuit 10 is attached) may be connected via one or more "planes" and one or more package "pins".

In the illustrated embodiment, the resonance limiter circuits 12A-12F may be enabled/disabled by the control unit 14. In one embodiment, the control unit 14 may provide a global enable to all the resonance limiter circuits 12A-12F. That is, Enable1 and Enable2 shown in FIG. 1 may be logically the same signal. The control unit 14 may be used to disable the resonance limiter circuits 12A-12F for a variety of reasons: if the package parasitics were inaccurately estimated during evaluation of the package; to adapt to a particular circuit board to which the packaged integrated circuit is attached; if the resonance limiter circuits 12A-12F are not working as intended; if the resonance limiter circuits 12A-12F are consuming more power than desired; at critical times that interference by the resonance limiter circuits may not be desired, such as during power up; and/or if resonance is not being experienced enough to warrant uses of the resonance limiter circuits 12A-12F; etc. In some embodiments, in addition to or instead of a global enable, the control unit 14 may provide two or more logically distinct enables. The resonance limiter circuits 12A-12F may be divided into two or more enable groups, each of which has a different enable (e.g. Enable1 may be provided to members of one enable group, Enable2 may be provided to members of another enable group, and the control unit 14 may control Enable1 and Enable2 independently of each other). The members of a given enable group may be physically distributed with respect to one another. In embodiments in which multiple resonant frequencies are compensated for using the resonance limiter circuits 12A-12F, the circuits tuned to a given frequency may be members of the same enable group, or different enabled groups. Having different enables may allow some of the resonance limiter circuits to be enabled while others are disabled, permitting the amount of resonance limiting to be changed by changing the enables.

The control unit 14 may generate the enables in any desired fashion. For example, the control unit 14 may be coupled to receive one or more external signals supplied to the integrated circuit 10 to directly or indirectly control the enables. Alternatively, if the integrated circuit 10 includes a processor or is coupled to a processor, a register that is programmable via instruction execution may be used to determine the desired enables. In yet another alternative, the integrated circuit 10 may selectively blow fuses at manufacture to set the enables.

The number of resonance circuits may vary from embodiment to embodiment. For example, several hundred circuits per resonant frequency may be included, distributed across the integrated circuit 10, in some embodiments. In one embodiment, if all or most of the resonance circuits are simultaneously active, the total current consumed in the resonance limiter circuits may be approximately the same magnitude as the current consumed by the functional blocks in the integrated circuit 10 during operation.

Figure 2:
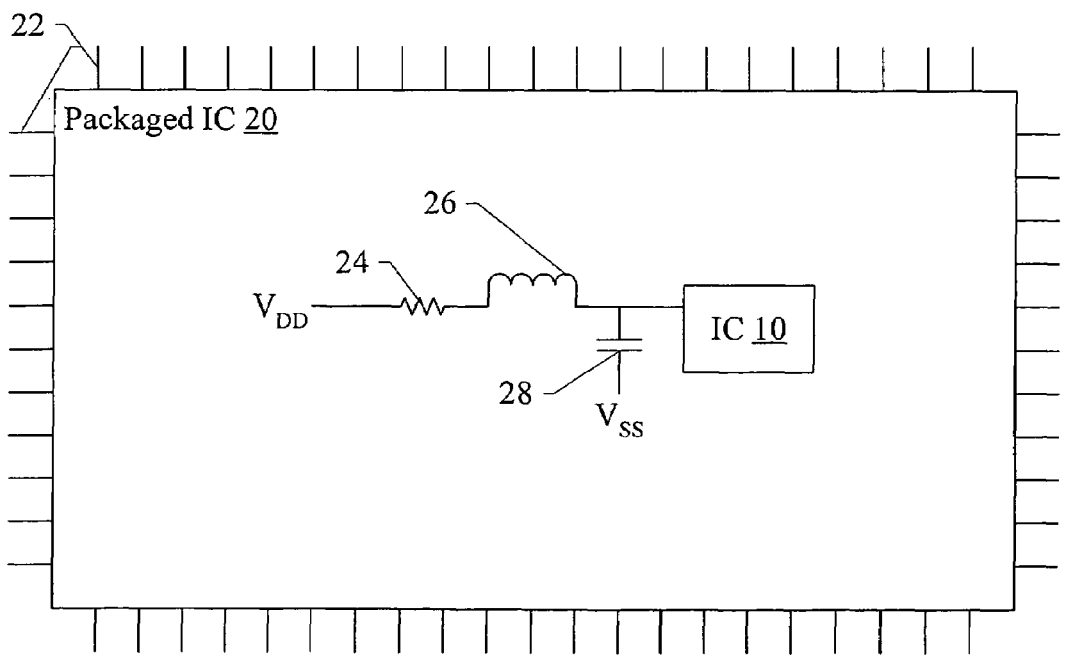
FIG. 2 is a block diagram of one embodiment of a packaged integrated circuit and a model of the package resonance circuit.

Turning now to FIG. 2, a block diagram of one embodiment of a packaged integrated circuit 20 is shown. The packaged IC 20 includes the integrated circuit 10. Various pins 22 on the exterior of the package may be used to electrically couple the integrated circuit 10 to other components on a board. One or more of the pins may be used to provide the supply voltage $V_{DD}$. Illustrated in FIG. 2 is a model of the package's electrical properties, including a series resistance 24, a series inductance 26, and capacitance 28, which may comprise the bypass capacitance on the IC 10. The model has a resonant frequency that depends on the components shown, which can be estimated for a given package. Symmetrically, the resonance limiter circuits may also operate on the $V_{SS}$/GND connection of the supply.

While one integrated circuit 10 is shown in the packaged IC 20, other embodiments may include multiple integrated circuits as a multi-chip module. Additionally, in some embodiments, the package model may include multiple RLC networks to model more than one resonant frequency, for packages that may resonate at more than one frequency.

Figure 3:
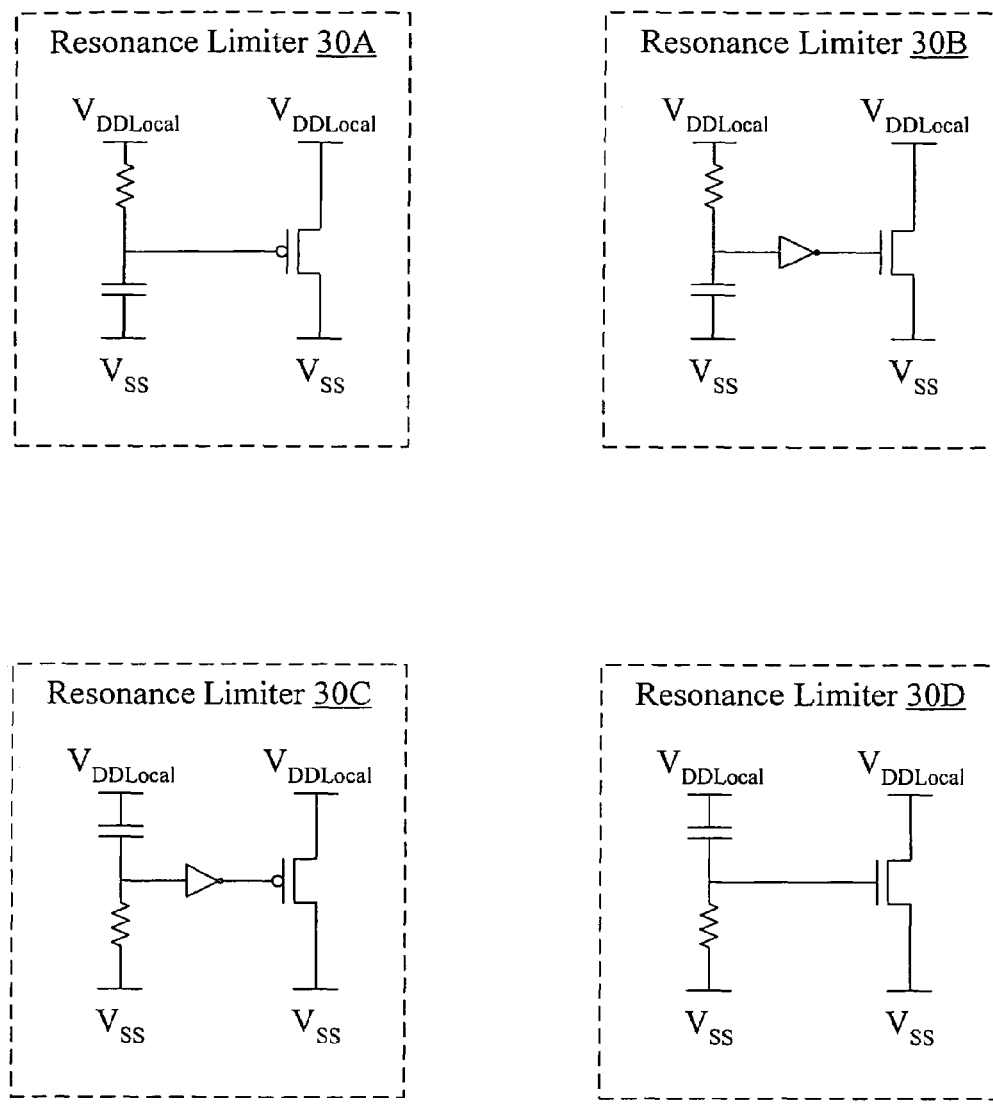
FIG. 3 is a block diagram of several embodiments of a simplified resonance limiter circuit.

Turning now to FIG. 3, several simplified embodiments of a resonance limiter circuit 30A-30D are shown. One or more of the resonance limiter circuits 12A-12F may implement any of the embodiments 30A-30D.

Generally, the resonance limiter circuits 30A-30D comprise a filter and a transistor coupled in parallel between the local power supply connection and the ground connection. The transistor may be a p-type metal-oxide-semiconductor (PMOS) transistor (circuits 30A and 30C) or an n-type MOS (NMOS) transistor (circuits 30B and 30D) for a complementary MOS (CMOS) implementation. In each case, the source-drain path is coupled between the power supply and ground, and the gate terminal is coupled directly or indirectly (through an inverter, in the illustrated embodiments) to the middle node of the filter circuit. The filter circuit has a resistor and capacitor, where the bandwidth of the filter (e.g. the RC product) is the inverse of the resonant frequency that the resonance limiter circuit is designed for (or the inverse of a frequency that is somewhat less than the resonant frequency, since the filter in each embodiment will pass frequencies higher than the RC product of the filter to the $V_{GS}$ voltage on the transistor. This relationship between the filter and the transistor, detecting and dampening frequencies at the bandwidth of the filter and higher, may exist for each embodiment (and embodiments in which the center node of the filter is coupled indirectly to the gate terminal of the transistor, such as through the inverter, an amplifier as shown in FIG. 4, a Schmidt trigger as shown in FIG. 4, etc.).

For the resonance limiter circuit 30A, a rapid increase in the supply voltage causes the gate to source voltage on the PMOS transistor to increase (in absolute value terms) and thus the PMOS transistor begins drawing current. As the supply voltage decreases, the PMOS transistor gradually turns off. For the resource limiter circuit 30B, the inverter is inserted so that the same filter network can be used with an NMOS transistor (which requires the gate voltage to be higher than the source, or ground in this embodiment). Constructing a capacitor having a node coupled to ground may be simpler in a CMOS process than having the node coupled to the power supply. The resonance limiter circuits 30C and 30D use the reverse configuration of the filter (capacitor coupled to the power supply) and thus the inverter is used with the PMOS transistor in the limiter circuit 30C and the inverter is not needed for the NMOS transistor in the limiter circuit 30D.

While the embodiments of FIG. 3 use CMOS transistors, other embodiments may use any transistor with a current path between two terminals (source and drain, for CMOS) controlled by a third (control) terminal (gate, for CMOS).

Figure 4:
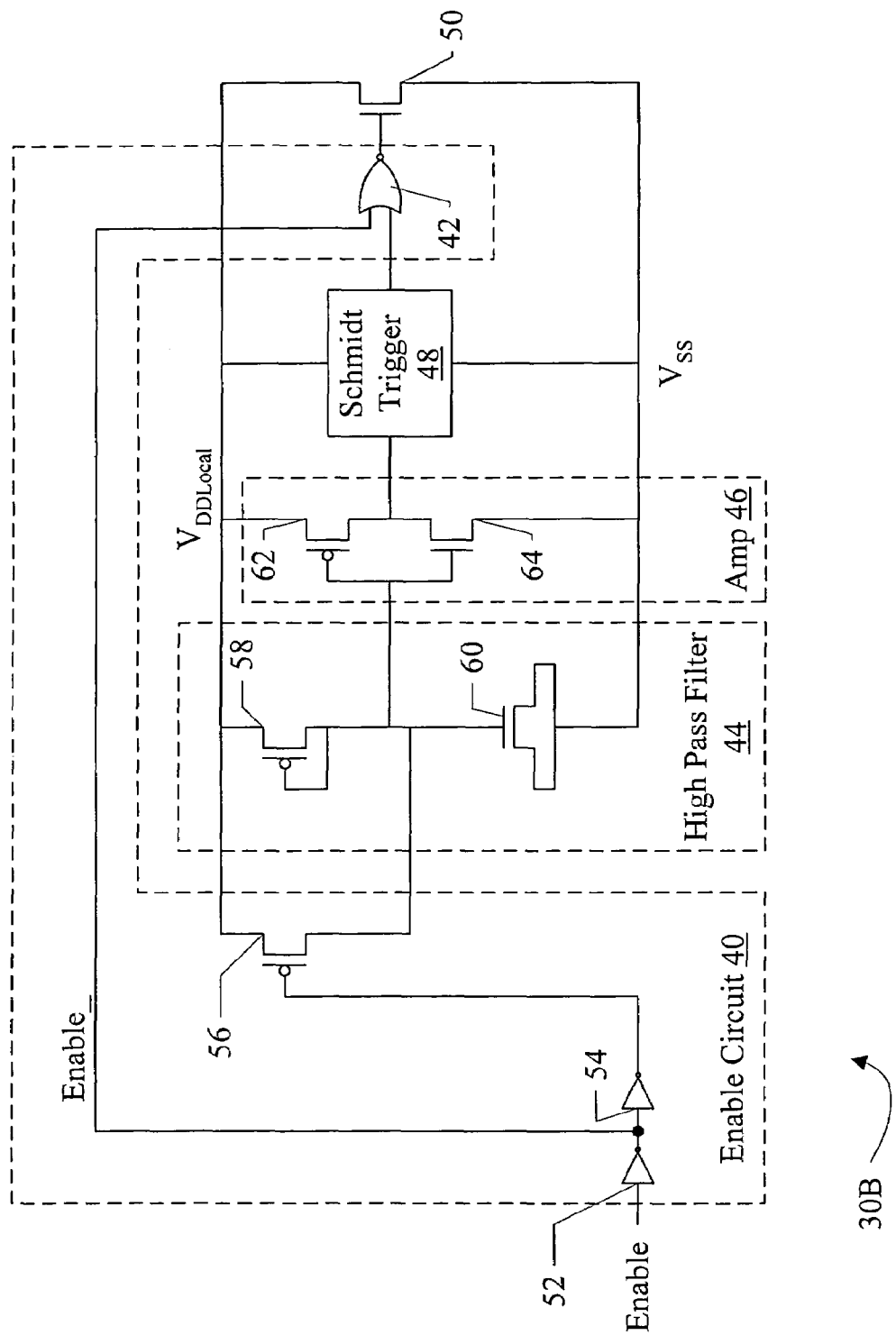
FIG. 4 is a circuit diagram of one embodiment of the resonance limiter circuit.

FIG. 4 is a circuit diagram of a more complex embodiment of the resonance limiter circuit 30B. More complex embodiments of the other circuits 30A and 30C-30D may also be constructed in similar fashion. In the embodiment of FIG. 4, enable/disable of the resonance limiter circuit 30B is supported with the enable circuit 40 (including the NOR gate 42, in this embodiment). The embodiment of FIG. 4 also includes a filter 44, an amplifier 46, a Schmidt trigger 48, and a transistor 50. The enable circuit is coupled to receive an enable input (e.g. from the control unit 14 shown in FIG. 1), and is coupled to the filter 44, which is coupled to the amplifier 46, which is coupled to the Schmidt trigger 48, which is coupled to the NOR gate 42, which is coupled to the gate terminal of the transistor 50. The circuits are also coupled to receive the $V_{DDLocal}$ supply voltage, and to $V_{SS}$ (ground).

The enable circuit comprises two series-coupled inverters 52 and 54 having the Enable input and having the output coupled to the transistor 56. The output of the first inverter 52 is supplied as the Enable_signal to the NOR gate 42. If the enable input is deasserted (low), indicating that the resonance limiter circuit 30B is disabled, the Enable_signal is high and thus the output of the NOR gate 42 is low regardless of the state of the output of the Schmidt trigger 48. Thus, the transistor 50 (an NMOS in this embodiment) is deactivated. If the transistor 50 were a PMOS, a NAND gate and a non-inverted enable signal may be used. Additionally, if the enable input is deasserted, the gate terminal of the transistor 56 is low, shorting the resistor in the filter 44 (transistor 58). If the enable signal is asserted, the transistor 46 is deactivated and the NOR gate 42 passes the inverse of the output of the Schmidt trigger circuit 48. Other embodiments may not include enable circuitry, and the enable circuit 40 may be deleted and the NOR gate 42 may be replaced by an inverter (or a wire, depending on the other components included in a given embodiment of the resonance limiter circuit).

The filter 44 comprises a resistor (formed from transistor 58 with its gate coupled to its drain) and a capacitor (formed from the transistor 60 with its gate coupled to the drain of the transistor 58 and its source and drain coupled to ground). The input to the amplifier 46 is coupled to the node between the resistor and the capacitor.

The amplifier comprises an inverter-like circuit including PMOS transistor 62 and NMOS transistor 64. However, the PMOS transistor 62 is a low threshold voltage ($V_T$) transistor in this embodiment, and thus is highly sensitive to changes in the $V_{DDLocal}$ supply voltage. In one embodiment, the PMOS transistor 62 may have a significantly higher drive strength than the NMOS transistor 64 (e.g. on the order of 10 to 1). Accordingly, the output of the amplifier 62, while amplifying the detection of the resonant frequency, may not be a solid digital one or zero ($V_{DDLocal}$ or $V_{SS}$). The Schmidt trigger 48 may be used to ensure a digital one or zero is provided to the NOR gate 42. The Schmidt trigger 48 may be of any desired construction, and is not shown in more detail in FIG. 4.

The Schmidt trigger 48 may be an inverting circuit. Accordingly, if the transistor 62 detects a resonant frequency change on the $V_{DDLocal}$ supply voltage connection (via the filter 44), the transistor 62 begins pulling its output up, which the Schmidt trigger outputs a low voltage, which the NOR gate 52 inverts to a high voltage, activating the NMOS transistor.

In some embodiments, the amplifier 46 and the Schmidt trigger 48 may be eliminated, and the filter output may be used directly as the input to the transistor 50 or may be input through an inverter. Such an embodiment would have more analog behavior than the digital embodiment shown. Accordingly, in various embodiments, the filter node and the transistor control terminal may be coupled either directly or indirectly (e.g. through the amplifier 46, Schmidt trigger 48, and NOR gate 42 in the illustrated embodiment). The term "coupled" is intended to include both direct and indirect connections. As mentioned previously, the enable circuitry may also be deleted if enable/disable functionality is not desired.

Figure 5:
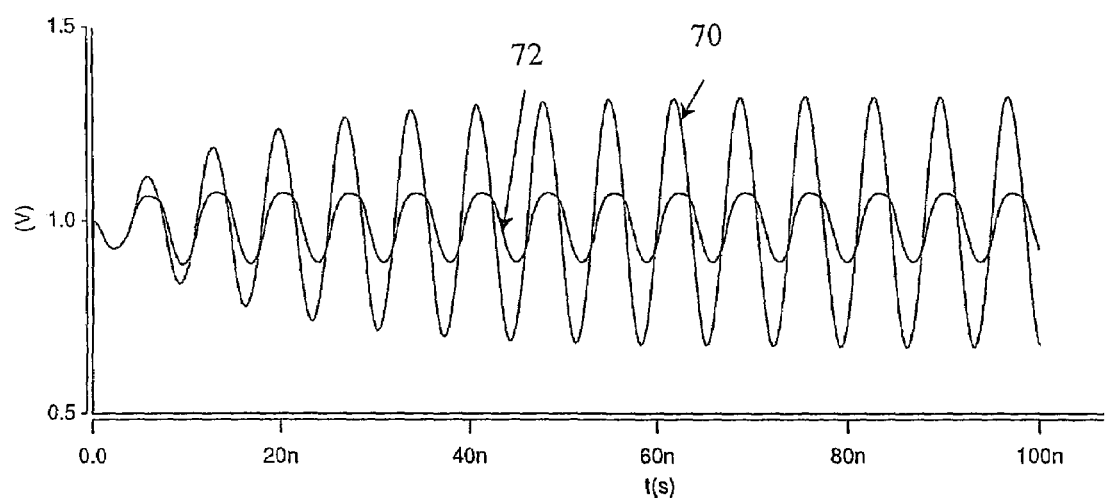
FIG. 5 is a timing diagram illustrating exemplary operation of an integrated circuit with and without resonance limiting.

Turning now to FIG. 5, a timing diagram is shown of the supply voltage for one embodiment of the integrated circuit 10 with variation at a resonant frequency. The supply voltage without the operation of the resonance limiter circuits (reference numeral 70) and with the operation of the resonance limiter circuits (reference numeral 72). As can be seen, the magnitude of the variation with the operation of the resonance limiter circuits is substantially reduced as compared to the magnitude of the variation without the operation of the resonance limiter circuits.

Figure 6:
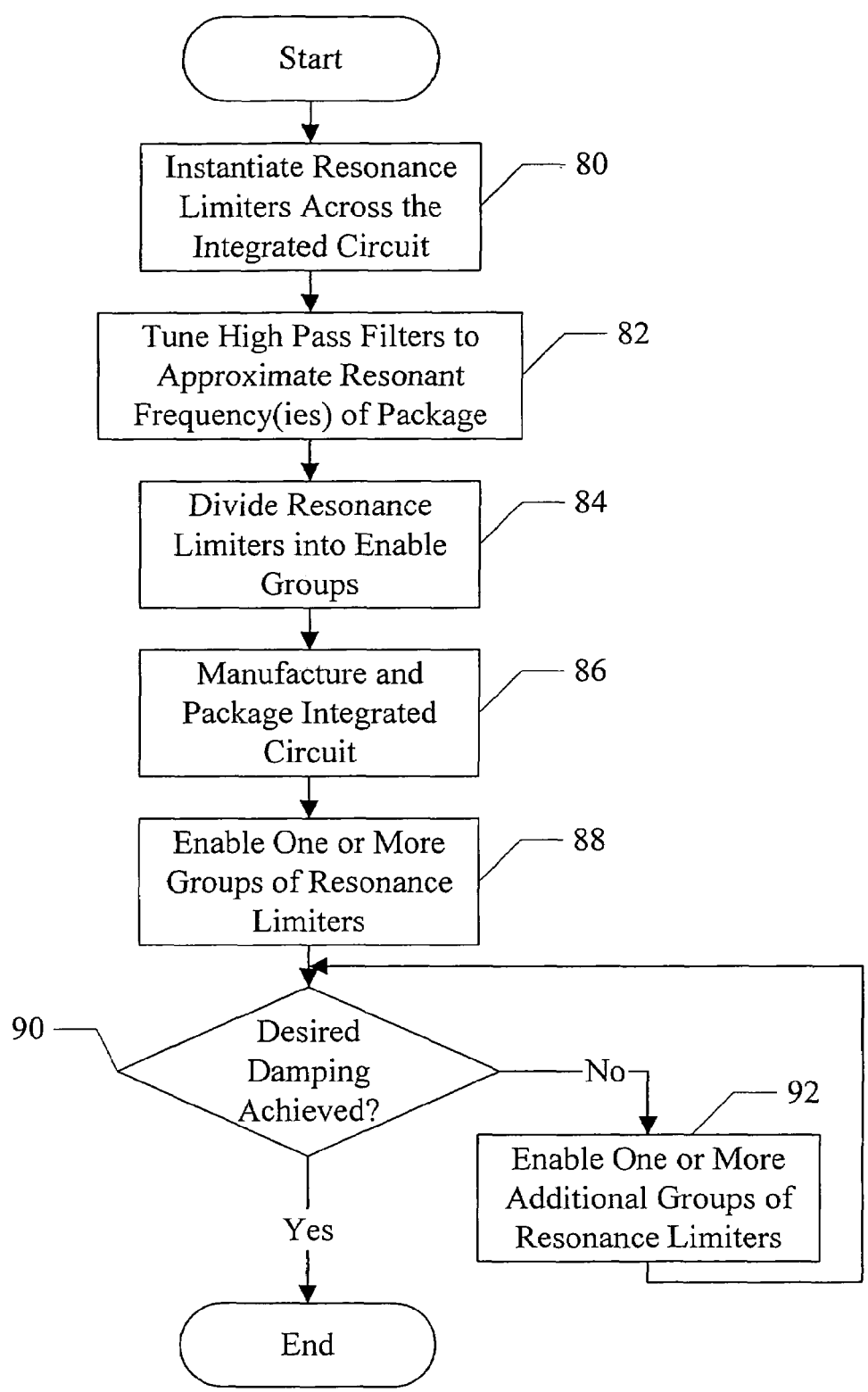
FIG. 6 is a flowchart illustrating a method of designing and using resonance limiter circuits.

FIG. 6 is a flowchart illustrating one embodiment of a method for designing and using resonance limiter circuits. While the blocks are shown in a particular order for ease of understanding, other orders may be used, as desired. Furthermore, blocks may be performed in parallel, as desired.

Resonance limiter circuits are instantiated across the integrated circuit (block 80). Sufficient numbers of circuits are included to consume approximately the same amount of current as the functional blocks in the integrated circuit 10, to compensate for the desired number of resonant frequencies, etc. The filters in the resonance limiter circuits are tuned to approximately the resonant frequency or frequencies of the package (block 82). If multiple, logically separate enables are used, the resonance limiter circuits are divided into enable groups (block 84) and connected to the appropriate enable signal(s). The integrated circuit 10 may subsequently be manufactured and packaged (block 86). During test or use, at least one of the enable groups may be enabled (block 88). If the desired damping has not been achieved (decision block 90, "no" leg), additional enable group(s) may be enabled and the supply voltage may be measured again (block 92). If the desired damping has been achieved (decision block 90, "yes" leg), the method may end.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a plurality of resonance limiter circuits coupled to a power supply connection of the integrated circuit, wherein the plurality of resonance limiter circuits are configured to detect oscillation on the power supply connection for at least a resonant frequency and to dampen the resonant frequency oscillation responsive to detecting the oscillation, wherein the resonant frequency depends on electrical characteristics of a package of the integrated circuit, wherein the package protects the integrated circuit and provides for electrical connection of the integrated circuit to other components, and wherein the plurality of resonance limiter circuits comprise two or more groups of resonance limiter circuits; and
an enable unit coupled to the plurality of resonance limiter circuits, wherein the enable unit is configured to provide logically separate enables to each group, whereby the groups are separately enableable.

2. The integrated circuit as recited in claim 1 wherein the plurality of resonance limiter circuits are configured to dampen the oscillation by drawing current from the power supply connection.

3. The integrated circuit as recited in claim 2 wherein the current drawn by the plurality of resonance limiter circuits, if the plurality of resonance limiter circuits are activated concurrently, is approximately equal in magnitude to the current drawn by the integrated circuit in operation.

4. The integrated circuit as recited in claim 1 wherein the plurality of resonance limiter circuits are physically distributed across the integrated circuit, and wherein each of the plurality of resonance limiter circuits is coupled to receive a power supply voltage local to its physical location in the integrated circuit.

5. The integrated circuit as recited in claim 1 wherein each of the plurality of resonance limiter circuits comprises a filter and a transistor, wherein the filter is coupled in parallel with the transistor between the power supply connection and a ground connection.

6. The integrated circuit as recited in claim 5 wherein a control terminal of the transistor is coupled to the filter.

7. The integrated circuit as recited in claim 6 wherein each of the plurality of resonance limiter circuits comprises an amplifier coupled to the filter and a Schmidt trigger coupled to the amplifier, wherein an output of the Schmidt trigger is coupled to the control terminal.

8. The integrated circuit as recited in claim 7 wherein the amplifier comprises at least one low threshold voltage transistor configured to detect changes in a supply voltage on the power supply connection.

9. The integrated circuit as recited in claim 5 wherein the filter is a high pass filter.

10. The integrated circuit as recited in claim 5 wherein the filter is tuned to approximately the resonant frequency.

11. The integrated circuit as recited in claim 1 wherein a first resonance limiter circuit in a first group is tuned to a first resonant frequency and a second resonance limiter circuit in the first group is tuned to a second resonant frequency different from the first resonant frequency.

12. The integrated circuit as recited in claim 1 wherein a first group of the plurality of resonance circuits is tuned to a first resonant frequency and a second group of the plurality of resonance limiter circuits is tuned to a second resonant frequency different from the first resonant frequency.

13. The integrated circuit as recited in claim 1 wherein ones of the plurality resonance circuits within the same group are physically distributed from each other across the integrated circuit.

14. A resonance limiter circuit comprising:
- a filter tuned to approximately a resonant frequency that depends on electrical characteristics of a package corresponding to an integrated circuit into which the resonance limiter circuit is fabricated, wherein the package protects the integrated circuit and provides for electrical connection of the integrated circuit to other components;
- a transistor coupled in parallel with the filter between a power supply connection and a ground connection, wherein the transistor includes a control terminal;
- an amplifier coupled to the filter; and
- a Schmidt trigger coupled to the amplifier, wherein an output of the Schmidt trigger is coupled to the control terminal of the transistor.

15. The resonance limiter circuit as recited in claim 14 wherein the amplifier comprises at least one low threshold voltage transistor configured to detect changes in a supply voltage on the power supply connection.

16. The resonance limiter circuit as recited in claim 14 wherein the filter is a high pass filter.

17. The resonance limiter circuit as recited in claim 14 further comprising a logic gate coupled to receive an enable signal and connected to the output of the Schmidt trigger, wherein an output of the logic gate is connected to the control terminal of the transistor, wherein, if the enable signal indicates disabled, the output of the logic gate is in a first state that disables the transistor, and wherein, if the enable signal indicates enabled, the control terminal is controlled responsive to the output of the Schmidt trigger.

18. The resonance limiter circuit as recited in claim 17 wherein the logic gate comprises a NOR gate. high pass filter.

19. A method comprising:
- instantiating a plurality of resonance limiter circuits in an integrated circuit design, the plurality of resonance limiter circuits physically distributed across the integrated circuit design;
- tuning the plurality of resonance limiter circuits to at least one approximate resonant frequency that depends on electrical characteristics of a package comprising the integrated circuit, wherein the package protects the integrated circuit and provides for electrical connection of the integrated circuit to other components, wherein the plurality of resonance limiter circuits are divided into at least two groups;
- activating at least one of the groups of the plurality of resonance limiter circuits responsive to detecting the resonant frequency on a power supply connection of the integrated circuit;
- determining if a desired damping of the resonant freciuency has been achieved; and
- responsive to determining that the desired damping has not be achieved, enabling one or more additional groups of the plurality of resonance limiter circuits.

20. The method as recited in claim 19 wherein the tuning comprises:
- tuning a first resonance limiter circuit in a first group to a first resonant frequency; and
- tuning a second resonance limiter circuit in the first group to a second resonant frequency different from the first resonant frequency.

21. The method as recited in claim 19 wherein the tuning comprises:
- tuning a first group of the plurality of resonance circuits to a first resonant frequency; and
- tuning a second group of the plurality of resonance limiter circuits to a second resonant frequency different from the first resonant frequency.

* * * * *